(12) United States Patent
Alvarez et al.

(10) Patent No.: US 10,559,217 B2
(45) Date of Patent: Feb. 11, 2020

(54) METHODS AND APPARATUS TO DEVELOP IN-VEHICLE EXPERIENCES IN SIMULATED ENVIRONMENTS

(71) Applicant: Intel Corporation, Santa Clara, CA (US)

(72) Inventors: Ignacio Alvarez, Portland, OR (US); Laura Rumbel, Portland, OR (US); Adam Jordan, Berkeley, CA (US); Carlos Montesinos, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 695 days.

(21) Appl. No.: 15/229,996

(22) Filed: Aug. 5, 2016

(65) Prior Publication Data
US 2018/0040256 A1    Feb. 8, 2018

(51) Int. Cl.
G09B 5/02    (2006.01)
G09B 9/05    (2006.01)
G06F 17/50   (2006.01)

(52) U.S. Cl.
CPC .......... G09B 9/05 (2013.01); G06F 17/5095 (2013.01)

(58) Field of Classification Search
CPC ... G09B 9/04; G09B 9/02; G09B 9/05; G09B 9/052
See application file for complete search history.

(56) References Cited

U.S. PATENT DOCUMENTS

| 8,004,395 | B2 | 8/2011 | Okamoto et al. |
| 8,417,490 | B1 | 4/2013 | Preston et al. |
| 8,849,492 | B2 | 9/2014 | Uno |
| 9,342,993 | B1 | 5/2016 | Fields et al. |
| 2006/0040239 | A1* | 2/2006 | Cummins ............... G09B 9/05 434/62 |

(Continued)

FOREIGN PATENT DOCUMENTS

| JP | 2008239145 | 10/2008 |
| WO | 2015133786 | 9/2015 |

OTHER PUBLICATIONS

International Search Authority, "Search Report" issued in connection with PCT Application No. PCT/US2017/040724 dated Oct. 13, 2017, 7 pages.

(Continued)

*Primary Examiner* — David L Lewis
*Assistant Examiner* — Shauna-Kay Hall
(74) *Attorney, Agent, or Firm* — Hanley, Flight & Zimmerman, LLC

(57) ABSTRACT

Methods, apparatus, systems and articles of manufacture are disclosed to develop driving simulations. An example apparatus includes a vehicle configuration engine to retrieve first tier environment parameters associated with a simulation type, and generate second tier environment parameters associated with the simulation type, a simulation modifier (SM) source engine to identify a source of SMs, and distinguish respective ones of the source of SMs that are compatible with the simulation type and the second tier environment parameters, and a development environment configuration engine to improve simulation design efficiency by associating simulation events with only the respective ones of the SMs that are compatible with the simulation type.

20 Claims, 11 Drawing Sheets

(56) References Cited

U.S. PATENT DOCUMENTS

| | | | | |
|---|---|---|---|---|
| 2007/0088469 A1* | 4/2007 | Schmiedel | G05D 1/0274 | 701/23 |
| 2007/0252696 A1* | 11/2007 | Belisle | B60R 25/102 | 340/572.1 |
| 2007/0294073 A1* | 12/2007 | Okamoto | B60K 35/00 | 703/20 |
| 2008/0309474 A1* | 12/2008 | Okamoto | B60K 35/00 | 340/462 |
| 2009/0162814 A1* | 6/2009 | Swan | G09B 9/04 | 434/69 |
| 2009/0294073 A1* | 12/2009 | Takizawa | B29C 45/7207 | 156/498 |
| 2009/0306880 A1* | 12/2009 | Gomi | G09B 9/052 | 701/117 |
| 2010/0030546 A1* | 2/2010 | Dong | B60R 16/0207 | 703/14 |
| 2010/0100365 A1* | 4/2010 | Moriyama | G06F 17/5009 | 703/8 |
| 2010/0131947 A1* | 5/2010 | Ackley | A63F 13/12 | 718/1 |
| 2011/0288840 A1* | 11/2011 | Kropinski | G06F 17/5009 | 703/8 |
| 2012/0070804 A1* | 3/2012 | Pang | G09B 9/02 | 434/29 |
| 2015/0100179 A1* | 4/2015 | Alaniz | A63F 13/00 | 701/1 |
| 2015/0158486 A1 | 6/2015 | Healey et al. | | |
| 2015/0221230 A1 | 8/2015 | Karadjian et al. | | |
| 2015/0310758 A1 | 10/2015 | Daddona et al. | | |
| 2016/0210382 A1* | 7/2016 | Alaniz | G05D 1/0221 | |
| 2017/0103147 A1* | 4/2017 | Khanna | G06F 17/5009 | |

OTHER PUBLICATIONS

International Search Authority, "Written Opinion" issued in connection with PCT Application No. PCT/US2017/040724 dated Oct. 13, 2017, 4 pages.

Alvarez et al., "Skyline: a Rapid Prototyping Driving Simulator for User Experience," AutomotiveUI '15, Sep. 1-3, 2015, 8 pages.

* cited by examiner

METHODS AND APPARATUS TO DEVELOP IN-VEHICLE EXPERIENCES IN SIMULATED ENVIRONMENTS

FIELD OF THE DISCLOSURE

This disclosure relates generally to vehicle simulators, and, more particularly, to methods and apparatus to develop in-vehicle experiences in simulated environments.

BACKGROUND

In recent years, driving simulators have been used to reduce one or more dangers that untrained operators pose to the public. The driving simulators render one or more driving environments that may be controlled by research personnel to test one or more abilities of a driver under test. The drivers under test may be immersed within a simulation environment having any type of vehicle control equipment, such as a steering wheel, a gear shifter, turn signal controls, etc. Additionally, the simulation environment may include one or more user interfaces (UIs) to simulate one or more views that the driver under test is to experience during realistic driving experiences, such as a front windshield view, side window views, mirror views and/or instrumentation views (e.g., speedometer, clock, navigation system interface, radio interface, etc.).

DETAILED DESCRIPTION

Figure 1A:
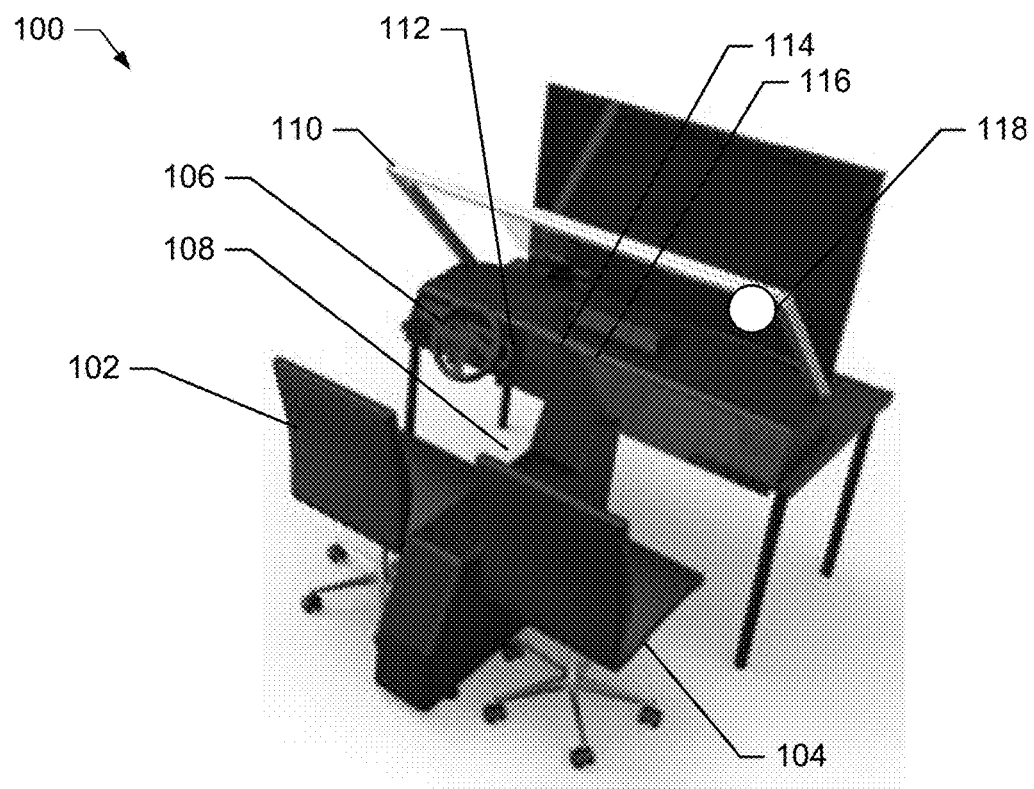
FIGS. 1A and 1B are schematic illustrations of example simulation structures to develop driving simulations.

Market-available driving simulators are typically designed for specific vehicle configurations and capabilities. In view of a particular vehicle to be used for training purposes, the simulator includes a vehicle-specific physical configuration (e.g., a seating area, control instrumentation, etc.) with vehicle-specific simulation features, such as a predetermined operating route user interface (UI) (e.g., graphical scenes of streets, roads, highways, traffic signals, etc.), a vehicle-specific heads-up-display (HUD), a vehicle-specific gear shift interface, a vehicle-specific length, a number of operator and/or passenger seats, and/or vehicle-specific sensors (e.g., heart rate sensor, eyelid sensor (camera), etc.). The market-available simulators function as a tool for training and education, provide visual, kinesthetic and/or auditory stimulus, and allow the trainee to operate the simulated vehicle by immersing the trainee with one or more UIs associated with an operating environment. Example operating environments include a driving route for the vehicle that responds to the trainee's inputs (e.g., brake pedal input, accelerator input, steering wheel input, turn signal input, headlight control input, etc.). Generally speaking, the market-available simulators generate simulated environments and perform standardized measures on driver performance and/or cognitive workload.

During trainee operation of the market-available simulator, the trainee is presented with any number of simulated operating experiences in an effort to provide the trainee with a realistic environment to develop and/or test necessary skills to safely operate a candidate vehicle and/or maintain public safety while operating the candidate vehicle. In some examples, secondary activities may be monitored to evaluate how the trainee responds, such as interactions with in-vehicle systems (e.g., radio, infotainment systems, wireless telephones, etc.). However, while the market-available simulator provides vehicle-specific simulation features and/or vehicle-specific training scenarios, such market-available simulators lack an ability to adapt to one or more alternate vehicle types without substantial hardware reconfiguration and software reprogramming efforts. Additionally, market-available simulators seek to provide real-world instruction to trainees for the purpose of proper vehicle operation, but lack an ability to permit vehicle research personnel to modify the simulation experience for one or more other objectives, such as in-vehicle feature/design testing, development, evaluation of vehicle design stability, maneuverability and/or ergonomics. For example, in the event vehicle research personnel seek information related to preferred placement of one or more vehicle controls in the simulator (e.g., rapid prototyping of one or more ergonomic designs, investigate new/alternate controls and/or displays (e.g., passenger displays, dashboard displays, etc.)), such market-available simulators lack an ability to dynamically reposition such controls in the simulated environment and/or lack an ability to dynamically modify how such vehicle controls operate. Instead, in the event the market-available simulator is to be reconfigured to include additional or alternate sensors, additional or alternate user interfaces, additional or alternate triggers, etc., then time consuming reprogramming and/or hardware redesign efforts are required. In other words, market-available simulators do not permit rapid prototyping (e.g., rapid modification of one or more candidate interactions) of in-vehicle user interactions beyond training and/or performance measure purposes.

Example methods, systems, apparatus and/or articles of manufacture disclosed herein facilitate a simulation environment development framework that enables dynamic configuration of simulation elements with improved speed, greater reconfiguration efficiency, lower cost, lower reliance on skilled software development expertise, and/or an increased ability to facilitate flexible sequencing of prescribed event(s). Generally speaking, examples disclosed herein facilitate a flexible interaction-focused simulator to highlight driving routes, invoke new interfaces and capture (log) simulation experience data. Example disclosed herein incorporate a physics environment engine (e.g., Unity®) to facilitate graphical scenes to allow a user (e.g., trainee, feature developer, etc.) to "follow the line" in a manner that is responsive to driving and/or other vehicle inputs (e.g., accelerator pedal inputs, brake inputs, NAVI system inputs, etc.). In some examples, the simulation environment may impose varying types of physics rules, such as rules that alter the graphical scenes in response to collisions with objects, rules that prevent simulated driving off a designated path, etc.

Examples disclosed herein generate and/or otherwise incorporate graphical user interface (GUI) elements, also referred to herein as "simulation modifiers (SMs)," that permit a simulation designer to assemble vehicle simulation experiences with improved efficiency and without time-consuming and expensive low-level programming efforts. As used herein, "GUI" is synonymous with "UI" and/or human-machine-interface (HMI), all of which include one or more visual, auditory and/or physical indicators (e.g., haptic feedback) to a user (e.g., the trainee, the vehicle research personnel, a simulation designer, etc.). As used herein, "SMs" are self-contained components (e.g., JavaScriptX (JSX)) that are programmed to respond to triggers, such as Message Queue Telemetry Transport (MQTT) messages. The SMs may include HTML5 or CSS scripts to render textual information in the example simulation structure 100, and may include scripted instructions (e.g. JSX) to facilitate control logic. The SMs further include graphical and/or textual input fields having values related to vehicle and/or SM operating parameters and/or thresholds. Any number and/or type of SMs may be associated with sequenced events of a simulation experience designed by the simulation designer, in which each SM may be built from scratch, reused (e.g., from one or more other simulation designers that have created one or more SMs on a prior occasion(s)), re-configured or modified.

Additionally, unlike static configurations of market-available simulators, examples disclosed herein dynamically include one or more additional simulation elements upon connection to the example simulation system. For example, in response to a new tablet personal computer (PC) making a request (e.g., request via navigation to a uniform resource locator (URL) of the example simulation system) to participate as a UI (e.g., a vehicle side-window view, a vehicle navigation system, a radio interface, a rear passenger view, etc.), examples disclosed herein register the new tablet PC as another simulation element for use during one or more simulations.

In some examples, each SM is assigned an identifier (ID) and associated UIs may be assigned a default number of zones/regions capable of being rearranged, deleted and/or otherwise substituted to render desired information. In still other examples, SMs facilitate a candidate prototype UI that, after simulation, evaluation and data logging, allow designers to pinpoint preferred UI configurations that could be used for production-level products and/or features. In particular, because UIs may be rendered on varying sized displays, such displays may be placed in different areas of the vehicle of interest to allow multimodal interactions and testing. Still further, example SMs disclosed herein facilitate predictive experiences during one or more journeys, in which scripted location-based triggers cause the SM or other SMs to render feature activity. For instance, in response to a location-based trigger related to proximity to a football stadium, the SM may trigger a team anthem, or in response to a speed-based trigger, the SM may trigger a speed alert indication. Still further, example SMs disclosed herein may employ third party sensors, such as sensors that facilitate industry standard I/O communication protocols.

FIG. 1A is a schematic illustration of an example simulation structure 100. In the illustrated example of FIG. 1, the simulation structure 100 includes vehicle elements (simulation elements), such as an example driver-side simulator seat 102, an example passenger-side simulator seat 104, an example steering wheel 106, example control pedals 108, an example main windshield view 110, an example vehicle instrumentation view 112 (e.g., speedometer, tachometer, temperature gauge, etc.), an example navigation system view 114 and an example center console view 116. While the illustrated example of FIG. 1A includes the example vehicle elements shown above, examples disclosed herein are not limited thereto. For example, if the simulation designer wanted to include a rear-view mirror, then a monitor, tablet, cell phone display, or other display could be mounted in the desired location (e.g., top center of the main windshield 110) and dynamically integrated into the simulation structure 100, as described in further detail below. Moreover, in addition to physical rearrangement flexibility of displays and/or sensors used with the example simulation structure, example SMs disclosed herein facilitate operational flexibility during simulation activity. In particular, and as described in further detail below, SMs include user-editable fields to control simulation operation of one or more components of the example simulation structure 100.

Generally speaking, one or more SMs may be configured and sequenced during a journey to mimic a candidate product under test, such as a new vehicle cabin temperature control system. The one or more example SMs may, in combination, facilitate the temperature control system UI by rendering a particular configuration of selectable buttons and cause one or more fans to respond to user input. User input activity may be logged for later evaluation by the simulation designer to serve as A/B testing in view of alternate configurations of temperature control systems, such as alternate combinations of SMs that present alternate UIs and/or control functionality to the user.

The example simulation structure 100 of FIG. 1A may include any number of additional and/or alternate displays and/or controls which may correspond to controls and displays found in existing vehicles or new and/or otherwise untested configurations. Additionally, the example simulation structure 100 of FIG. 1A may include one or more sensors and/or feedback devices (e.g., haptic feedback devices). In the illustrated example of FIG. 1A, the simulation structure 100 includes a camera 118 to monitor occupant eye movement, eye direction and/or eyelid state (e.g., open or closed). Example output of the camera 118 facilitates drowsiness detection and/or distracted driving behaviors. Additionally, the example simulation structure 100 of FIG. 1A may include sensors (e.g., hear-rate, skin-conductance, brain-computer interface, etc.), which may be attached to the passenger. Such sensors may assist in the detection of operator states such as, but not limited to fatigue or drowsiness.

Figure 1B:
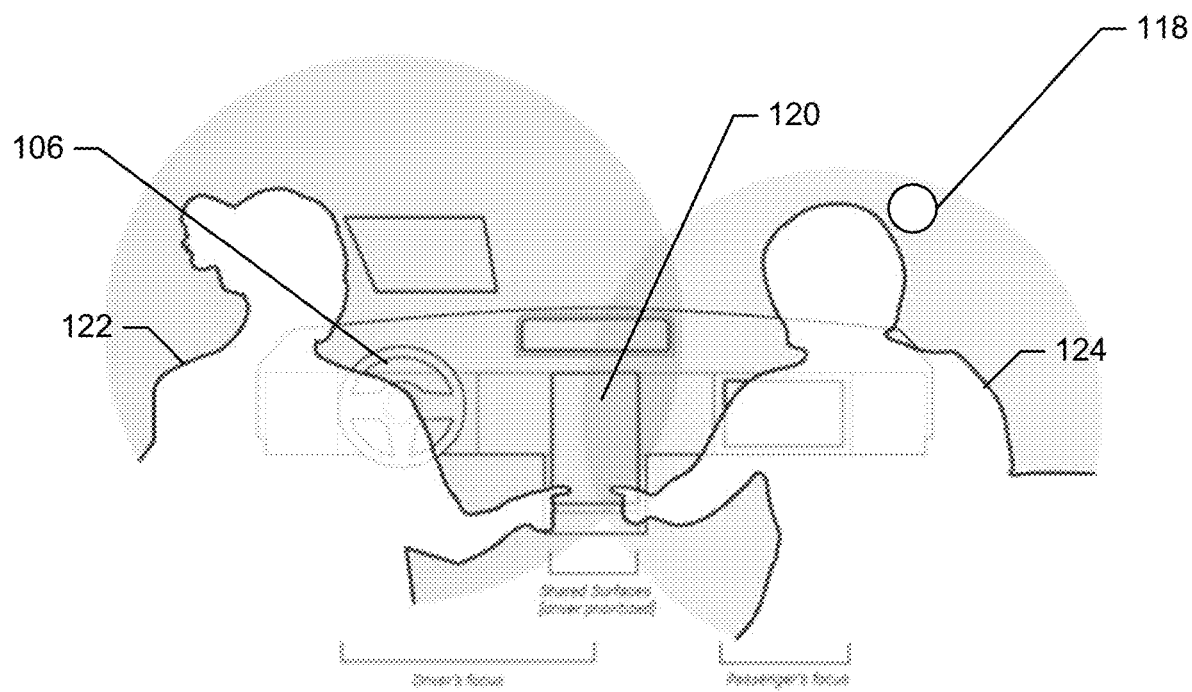

FIG. 1B is a schematic illustration of an alternate view of the example simulation structure 100 of FIG. 1A. Unlike market-available simulators that serve as a tool for training and education of a vehicle of interest, examples disclosed herein facilitate dynamic and rapid prototyping of candidate vehicle features and configurations beyond mere driving simulation activity. In some examples, candidate features relate to one or more driver and/or passenger (non-driver)

experiences when the vehicle is in motion or when the vehicle is at rest. In the illustrated example of FIG. 1B, a candidate UI 120 is installed in the simulation structure 100 to be accessed by either or both of a driver 122 and/or a passenger 124. The example candidate UI 120 may be facilitated as a tablet, mini-PC and/or any other networked display capable of wireless communication within the simulation structure 100, as described in further detail below.

The example candidate UI 120 of FIG. 1B may present a sequence of events based on external input(s) (e.g., inputs from the example driver 122), based on sequential scripts, based on simulated global positioning signal (GPS) coordinate inputs (e.g., the candidate UI 120 may operate as a candidate navigational system interface (NAVI)), and/or based on prompts/inputs controlled by the simulation designer (e.g., "wizard of oz" control via a networked PC, tablet, wireless telephone, etc.). In some examples, the simulation designer may initiate a mock telephone call from a networked device to cause the candidate UI 120 to present first graphical, audio and/or textual prompts that simulate receipt of a telephone call. Such first graphical, audio and/or textual prompts may be based on a first SM associated with the candidate UI 120. During operation of the first SM, the simulation designer may evaluate one or more behaviors of the driver 122 and/or the passenger 124 to retrieve valuable information relating to maneuverability, ergonomics, and/or preferences of the candidate UI 120. However, in the event the simulation designer wants to evaluate the maneuverability, ergonomics and/or preferences of an alternate candidate UI 120 that is tailored by and/or otherwise configured by information from a second SM (e.g., an SM that presents wireless phone control icons of an alternate size and/or location of the UI), then such second SM can be enabled (e.g., loaded and executed) by the simulation designer without exhaustive code development, code redesign and/or hardware redesign. In some examples, any number of alternate candidate UIs may be rapidly evaluated to log comparative feedback data. Some example UIs may employ varying designs of visual (e.g., graphical icons), auditory (e.g., voice notification/prompt), and/or physical (e.g., haptic feedback) stimuli to be comparatively evaluated, thereby allowing designers to improve product and/or feature development.

Figure 2:
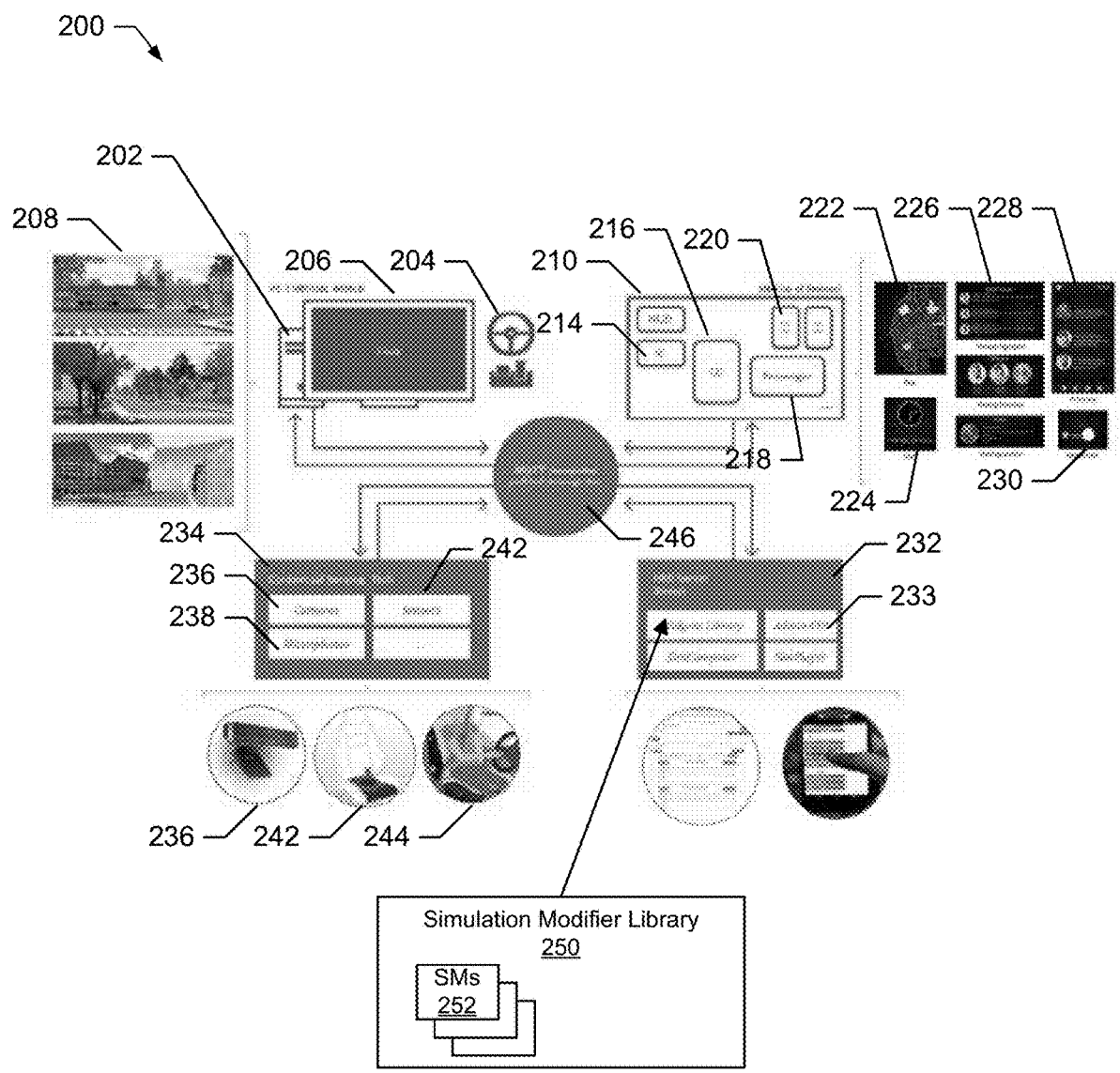
FIG. 2 is a schematic illustration of functional aspects of an example journey development system to develop driving simulations on the example simulation structures of FIGS. 1A and/or 1B.

FIG. 2 is a schematic illustration of functional aspects of an example journey development system 200. The example journey development system 200 may include any number and/or type of functional components of the example simulation structure 100 of FIGS. 1A and/or 1B. Such functional components of the example journey development system 200 may be facilitated by an example journey development engine, described in further detail below. In the illustrated example of FIG. 2, the journey development system 200 includes a personal computer (PC) 202 communicatively connected to physical vehicle controls 204 (e.g., vehicle elements such as a steering wheel, an accelerator pedal, a brake pedal, gear shifter, turn signal, etc.) and a main display 206. While the illustrated example of FIG. 2 includes a PC 202, such as a PC with a Windows®-based operating system (OS), examples disclosed herein are not limited thereto. In some examples, Linux®-based or Apple®-based operating systems may be used. In particular, because examples disclosed herein employ web-based technologies for SM implementation, operation may be OS agnostic. The example main display 206 may be a monitor and/or one or more tablet PCs communicatively connected to the example PC 202, and tailored and/or otherwise configured to simulate a front windshield viewpoint for a driver of a simulated vehicle. In some examples, graphical scenes 208 may be presented on the main display 206 in a movie-like fashion, in which the graphical scenes 208 advance and/or react in a manner proportional to inputs retrieved from the trainee or participant (e.g., speed of graphical scenes 208 proportional to accelerator input and/or brake input, angle and direction of graphical scenes 208 corresponding to steering wheel input (e.g., street changes)). The example graphical scenes 208 may be facilitated and/or otherwise rendered by a three-dimensional (3D) graphical engine, such as the example gaming framework by Unity®. The example graphical engine may be invoked and/or otherwise facilitated by the example PC 202.

In addition to physical vehicle controls 204, the illustrated example of FIG. 2 includes one or more UIs 210 that can facilitate user input and/or control over one or more vehicle elements. The example UIs may include an example heads-up-display (HUD) 212, an example instrument cluster (IC) 214, an example center console (CC) 216, an example passenger display 218, an example wireless telephone UI 220, etc. In some examples, UIs may include rear passenger displays and/or displays exterior to the vehicle of interest. Each UI may be associated with one or more corresponding SMs to define and/or otherwise tailor the behavior of the UI. For example, some SMs may define operational sequencing and design of an example NAVI interface 222, a clock interface/display 224, an in-vehicle text message aggregator interface 226, a wireless telephone interface 228, a speedometer 230, etc.

The example journey development system 200 also includes one or more servers 232 to store, manage and/or distribute one or more SMs of interest. Additionally, the one or more servers 232 facilitate simulation logging and storage to allow post-simulation evaluation. In some examples, the one or more servers 232 are part of the example PC 202. The example one or more servers 232 may include web servers to facilitate UI distribution (e.g., via Wi-Fi) to any number of displays, and include a wizard-of-Oz (WOZ) server and associated GUI to allow the simulation designer to exhibit real-time control over a simulation experience by the example driver 122 and/or passenger 124. The example one or more servers 232 may include an administrative GUI 233 to serve as a control interface of the example simulation structure 100. For example, in response to a request via the administrative GUI 233 to create, initiate or reconfigure a simulation on the example simulation structure 100, the example administrative GUI 233 presents the simulation manager with one or more textual and/or graphical controls to establish a sequence of simulation events that are tailored and/or otherwise configured by one or more SMs, as described in further detail below. The example servers 232 also include a simulation modifier (SM) library 250 that stores available SMs 252 to be used during the simulation(s). The example journey development system 200 also includes input/output (I/O) sensors 234 that can be installed in one or more locations of the example simulation structure 100. Example I/O sensors 234 include, but are not limited to cameras 236 (e.g., RGB cameras, depth cameras and/or infrared cameras to detect eye focus, eyelid closure state, etc.), microphones 238 and/or sensors 240. Sensors may include, but are not limited to heart rate sensors (e.g., installed on seat belts proximate to an operator/passenger heart 244), seat pressure sensors and/or haptic feedback devices 242, etc. Communication between elements of the example journey development system 200 may be handled by any communication protocol, such as an example Message Queue Telemetry Transport (MQTT) bus 246. The example MQTT bus 246 may also facilitate event handling (e.g., a publish-subscribe model), such as events initiated by a Node.js cross-platform runtime environment (e.g., hosted by the example server(s) 232). Such messages may also originate from web applications written with JavaScript in response to events that, as described above, facilitate a platform agnostic operation. However, the example MQTT bus 246 may also employ socket.io communications between one or more browsers that operate as displays and/or simulation elements of the journey development system.

Figure 3:
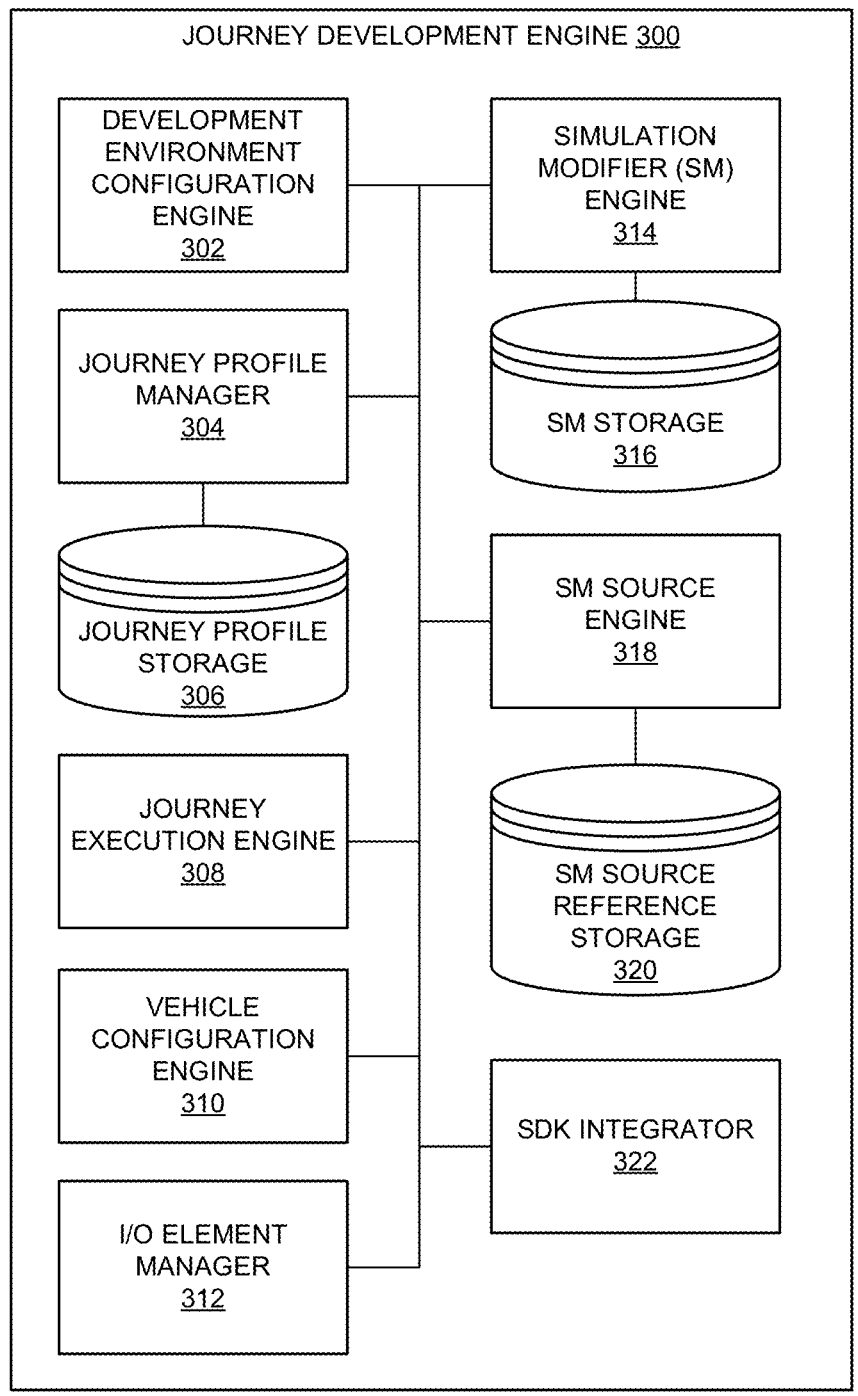
FIG. 3 is a schematic illustration of an example journey development engine constructed in accordance with the teachings of this disclosure to develop driving simulations.

FIG. 3 is a schematic illustration of an example journey development engine 300 to facilitate and/or otherwise control the example simulation structure 100 of FIGS. 1A and/or 1B, and the example journey development system 200 of FIG. 2. In the illustrated example of FIG. 3, the journey development engine 300 includes a development environment configuration engine 302, a journey profile manager 304 communicatively connected to a journey profile storage 306, a journey execution engine 308, a vehicle configuration engine 310, an I/O element manager 312, an SM engine 314 communicatively connected to an SM storage 316, an SM source engine 318 communicatively connected to an SM source reference storage 320, and a software development kit (SDK) integrator 322. In some examples, the journey profile manager 304, the SM engine 314 and/or the journey execution engine 308 may facilitate logging and data storage of simulation activity. The example SM storage 316 may implement storage functionality of the example SM library 250 and/or logging storage described above in connection with FIG. 2.

In operation, the example development environment configuration engine 302 determines whether a new configuration request has occurred, or whether a request to reuse or modify an existing simulation environment profile has occurred, either of which may be detected by the development environment configuration engine 302 from the example administrative GUI 233 of FIG. 2. In the event a new configuration is to occur, then the example vehicle configuration engine 310 generates first tier environment parameters to be selected and/or otherwise entered by the simulation developer.

Figure 4:
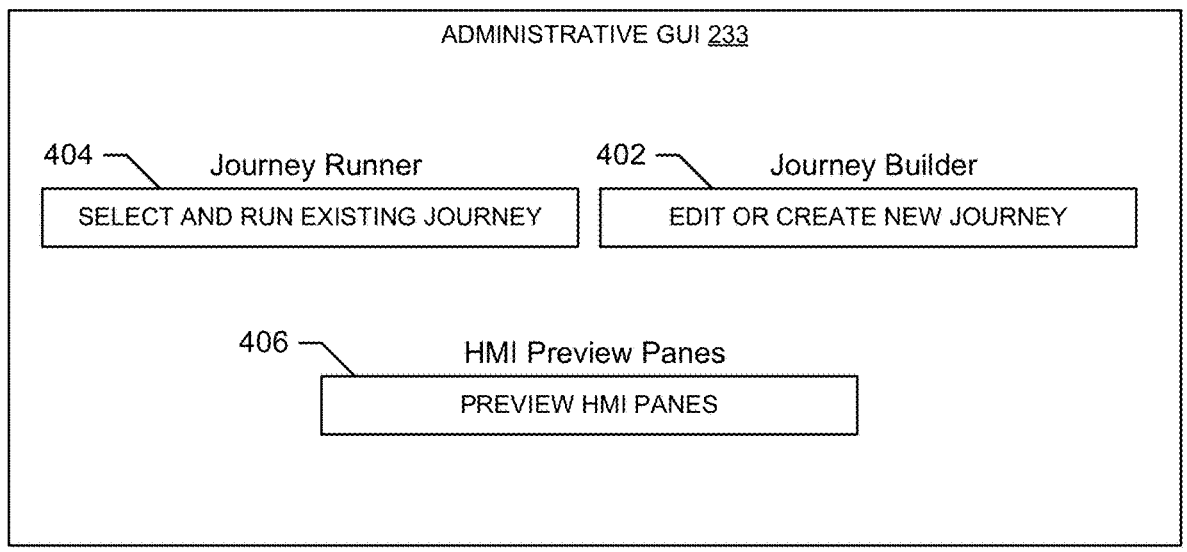
FIG. 4 is an example administrative graphical user interface rendered by the example journey development engine of FIG. 3.

FIG. 4 includes a screenshot of the example administrative GUI 233 of FIG. 2. In the illustrated example of FIG. 4, the administrative GUI 233 includes a journey builder button 402 to initiate editing and/or creation of journey profiles to execute during simulation exercises, a journey runner button 404 to select and run existing journeys that have been configured during a prior instance, and a human-machine-interface (HMI) preview pane button 406 to display previews of one or more GUIs/HMIs of a journey of interest. As used herein, a "journey" is a sequence of one or more events that occur in a simulation, in which each simulation event can be specified, tailored, configured and/or otherwise customized in view of one or more SMs. In other words, the journey facilitates and/or otherwise defines one or more mobility experiences for in-vehicle, out-of-vehicle, in-motion and/or motion (e.g., driving exercise) based simulation activities. In some examples, in-vehicle experiences include moving graphical scenes and/or sequences of scenes in a movie-like fashion (e.g., invoked by a request of an SM) that are facilitated by the example graphics engine. The graphics engine may be part of the example PC 202, or facilitated by the example journey execution engine 308, in which one or more driving scenes/sequences may be defined by configurations identified by one or more SMs (e.g., an SM that invokes a "follow-the-line" driving experience through city streets, an SM that invokes a snow-packed road that increases simulated braking distances due to slippery conditions, etc.). In some examples, in-vehicle experiences may include non-driving and/or otherwise stationary simulated interactions with vehicle systems and/or components, such as wireless telephone (smartphone) interactions, NAVI system interactions, heating/cooling system interactions, radio/infotainment system interactions, etc. One or more SMs may also define and/or otherwise facilitate out-of-vehicle simulations and prototyping. For example, one or more SMs may define simulations for vehicle locking activities (e.g., key fob behavior), trunk unlocking, rear gate opening/closing, alarm functions, etc. In the event the simulation designer wishes to create a new journey, as described in further detail below, the selection of the example journey builder button 402 may result in the example vehicle configuration engine 310 generating an example vehicle simulation initialization screen 500, as shown in FIG. 5.

Figure 5:
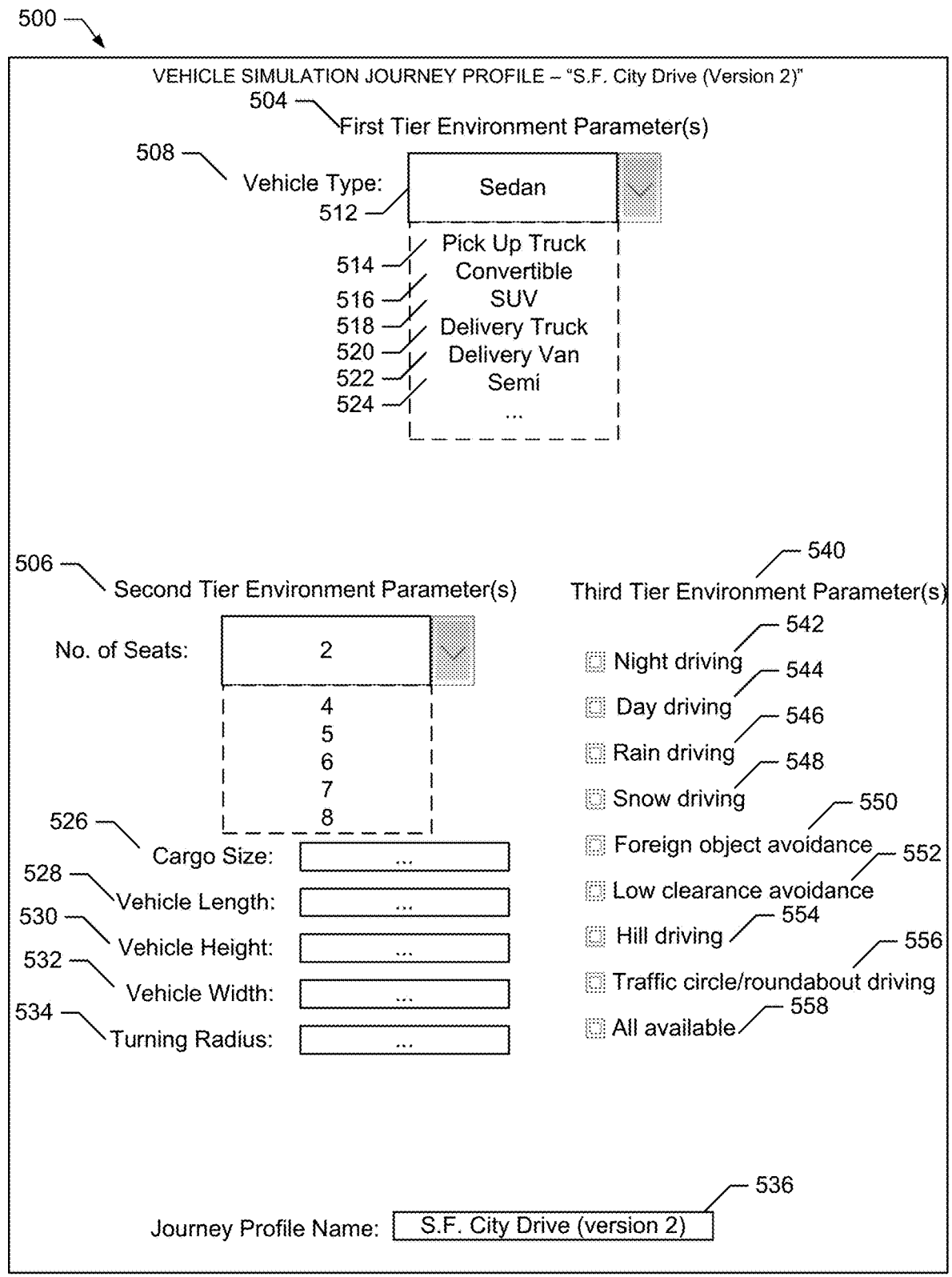
FIG. 5 is an example vehicle simulation initialization screen rendered by the example journey development engine of FIG. 3.

FIG. 5 includes an example screenshot of the vehicle simulation initialization screen 500. In the illustrated example of FIG. 5, the vehicle simulation initialization screen 500 includes a simulation environment profile name 502, first tier environment detail 504, and second tier environment detail 506. The example first tier environment detail 504 initially receives and/or otherwise retrieves high-level categorization parameters of the type of simulation to be configured, such as a vehicle type 508. The example vehicle type 508 includes a corresponding vehicle type drop down selection field 510 that may be populated with any number and/or type of vehicle. In the illustrated example of FIG. 500, the selection field 510 includes a sedan parameter 512, a pick-up truck parameter 514, a convertible parameter 516, a sport utility vehicle (SUV) parameter 518, a delivery truck parameter 520, a delivery van parameter 522, and a semi parameter 524. The example vehicle type drop down selection field 510 is shown with examples, and is not to be seen as a limitation to the variety of vehicle types that may be realized with examples disclosed herein. In fact, while road-based vehicles are described in examples disclosed herein, other types of vehicles may be realized including, but not limited to, construction vehicles (e.g., bulldozers, cranes, etc.), flying vehicles (e.g., airplanes, drones, quad-copters), sea vehicles (e.g., boats), industry vehicles (e.g., floor cleaning vehicles, fork trucks, etc.) and/or trains.

In response to the example vehicle configuration engine 310 detecting a selection of the example vehicle type drop down selection field 510, the example vehicle configuration engine 310 generates second tier environment parameters 506 that correspond to the selection. For example, in the event the delivery truck parameter 520 is made for the vehicle type 508, then the example vehicle configuration engine 310 populates the example second tier environment parameters 506 with one or more fields that are relevant to a delivery truck, and/or otherwise removes one or more fields that have no relevance to the first tier information. As such, the example vehicle configuration engine 310 reduces a configuration burden on the user by eliminating superfluous data entry. In the illustrated example of FIG. 5, the vehicle simulation screen 500 includes a cargo size parameter 526, a vehicle length parameter 528, a vehicle height parameter 530, a vehicle width parameter 532, and a turning radius parameter 534. However, in the event an alternate vehicle type selection occurs in the example vehicle type drop down selection field 510, such as a selection of the convertible parameter 516, then one or more fields in the second tier environment detail 506 may change. For instance, fields/parameters related to the cargo size 526 and/or turning radius 534 may not be relevant and, therefore, removed. After one or more parameter selections have been received and/or otherwise retrieved, the example vehicle configuration engine 310 causes the example vehicle simulation screen 500 to display a journey profile name field 536 so that a particular configuration and/or set of simulation environment settings can be saved with a unique identifier.

The illustrated example of FIG. 5 also includes third tier environment parameters 540. In the illustrated example of FIG. 5, the third tier environment parameters 540 include a night driving selection 542, a day driving selection 544, a rain driving selection 546, a snow driving selection 548, a foreign object avoidance selection 550, a low clearance avoidance selection 552, a hill driving selection 554, a traffic circle/roundabout driving selection 556, and an all available selection 558. One or more of the example selections in the third tier environment parameters 540 may be available or removed from view based on one or more selections of the example first tier environment parameters 504 and/or the example second tier environment parameters 506. For example, in the event the first tier environment parameters 504 include a selection for a sedan 512 or a convertible 516, then the example low clearance selection 552 may be hidden from view because it is not relevant to such vehicle types.

Selection of one or more of the third tier environment parameters 540 consolidates available SMs that may be shown or otherwise available to the simulation designer during the configuration of one or more journeys. For example, in the event the night driving selection 542 is chosen, then available SMs that relate to night driving simulation experiences are made available during configuration and design of a simulation. As another example, in the event the foreign object avoidance selection 550 is chosen, then one or more SMs that relate to foreign object simulations are made available during the design of the simulation, such as SMs that employ vehicle object detection systems (e.g., radar-based detection) that operate in conjunction with video prompts of objects in a driver's windshield (e.g., deer, pedestrians, road debris, etc.). In some examples, the SMs may invoke varying degrees of stimuli during a simulation. For instance, a speed or rate at which a foreign object enters a simulated view/graphic may begin at a relatively low rate, such as a scene of a pedestrian walking into a crosswalk. Throughout the simulation, the example SM may be configured to initiate additional and/or alternate foreign objects at an alternate (e.g., faster) rate/speed of appearance, such as a bicycle entering a crosswalk at a relatively greater speed. Such stimuli may be configured at particular graduations, ramp rates and/or step functions.

The example SM engine 314 queries the example SM storage 316 to identify candidate SMs that are compatible with the selected vehicle type 508 and selected second tier environment detail 506. For example, one or more SMs may be associated with particular types of simulation features, sensors (e.g., object sensors, cameras, etc.), and/or experiences (e.g., rain driving conditions, snow driving conditions, foreign object avoidance/detection conditions, etc.). Example SMs, as described in further detail below, enable specific simulation functionality without requiring programming development effort by the simulation designer. An example SM (or a set of SMs) may be associated with a navigational system user interface that the simulation designer wishes to evaluate in front of one or more example drivers 122, one or more passengers 124 and/or combinations of drivers 122 and passengers 124 during a simulated vehicle experience (e.g., a driving simulation, a non-mobile in-cabin vehicle simulation, etc.). A first SM (or a first group of SMs) associated with the navigational system UI may have a first layout of control and user-selectable buttons/prompts, and the simulation designer can observe and evaluate (e.g., via data logging by the example journey execution engine 308) the interaction between the navigational system UI and one or more drivers 122 and/or passengers 124. However, the simulation designer may design an alternate navigational system UI in which the user-selectable buttons/prompts are arranged on a display in an alternate orientation, include alternate graphics, and/or include alternate textual/graphical icons. This example second/alternate navigational system UI may be tailored and/or otherwise configured by a second SM (or a second group of SMs) that specifies alternate graphical screens, alternate graphical screen positions, alternate button/prompt locations, etc. As such, the simulation designer may select any number of SMs to be used in one or more simulations without programming effort. In some examples, the list of candidate SMs with which the simulation designer may select is based on which combinations of first tier environment parameters 504, second tier environment parameters 506 and third tier environment parameters 540 are selected.

Figure 6:
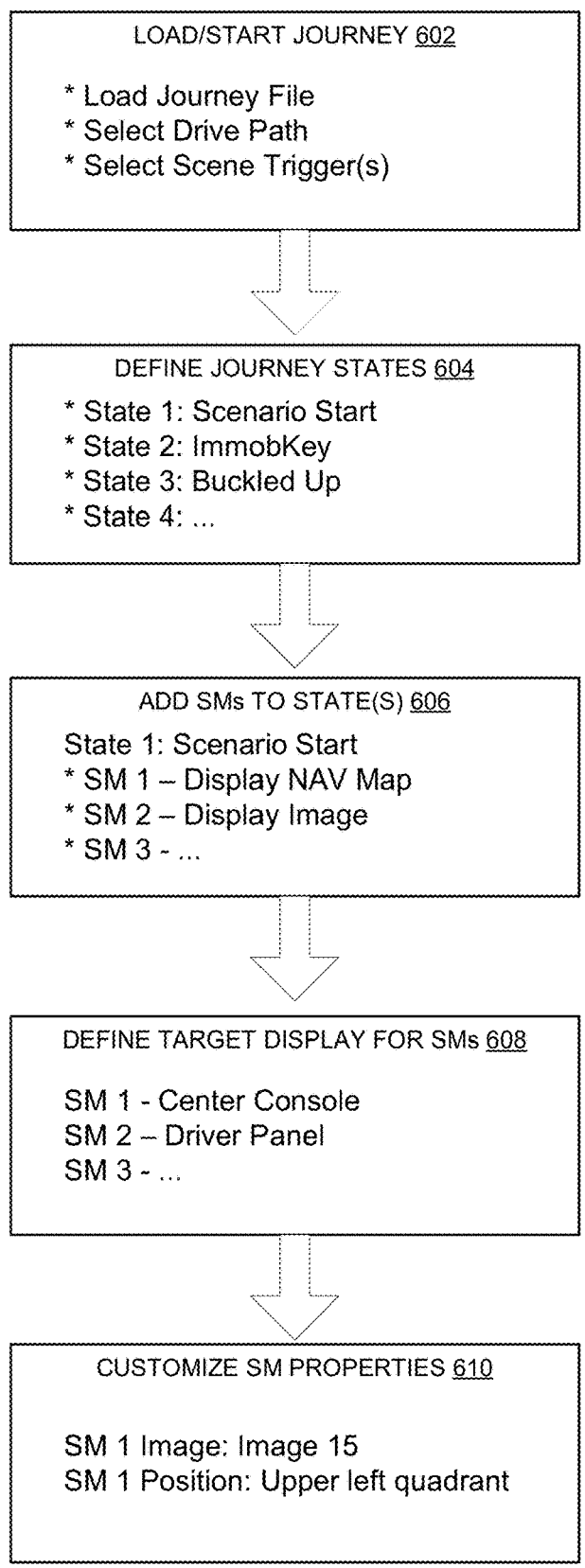
FIG. 6 illustrates example journey development and simulation modifier configuration screens rendered by the example journey development engine of FIG. 3.

FIG. 6 illustrates example journey development and SM configuration screens 600 in which journey states (events) are assigned and one or more SMs may be associated with each journey state. In the illustrated example of FIG. 6, a journey creation screen 602 allows a new journey to be created or an existing journey to be loaded and modified. In some examples, the example journey profile manager 304 queries the example journey profile storage 306 for one or more existing journeys that, as described above, include any number of events that occur (e.g., sequentially) in a simulation exercise, in which each event may include any number of SMs to perform specific functionality. The example journey creation screen 602 may include one or more data entry fields to create a new journey name, or to browse for existing journey profiles that have been previously created and are candidates for loading from the example journey profile storage 306.

In the illustrated example of FIG. 6, the screenshots 600 include a journey state definition screen 604, which permits the creation, modification and/or removal of one or more journey states (e.g., events to occur in a particular sequence during simulation execution). For example, a first journey state may be defined as "scenario start" where particular UIs are initialized within the example simulation structure 100. Another example journey state to occur after the example first journey state may be defined as "buckle up" where one or more UIs alert the driver and/or passenger to fasten their seat belts. The example screenshots 600 of FIG. 6 also include an SM addition screen 606 where one or more SMs may be associated with particular ones of the example journey states. For example, the example journey state defined as "scenario start" may include a first SM named "Display NAV Map," which identifies a particular graphic to be rendered on a particular display (e.g., a center console display) within the example simulation structure 100. Additional detail of the "Display NAV Map" may include a particular quadrant (e.g., zone) of the selected display in which to display the graphic of interest, which may be configured in an example SM display screen 608 (which includes drop down fields to identify which display the graphic is to appear), and may further be configured on an SM customization screen 610 (which includes drag-and-drop customization of graphic placement within the selected screen, such as which portion of the center console to place the graphic). In some examples, the "scenario start" journey state may include additional SMs, such as another SM to configure the center console to display alternate information in one or more separate quadrant(s). As described above, the types of SMs with which the simulation designer may select may be based on tag information compatibility with one or more of the example first tier environment parameters 504, second tier environment parameters 506 and third tier environment parameters 540. For example, each SM may include tag information or other details to indicate a category type of the SM (e.g., related to sedan-type vehicle experiences, related to delivery truck type experiences, related to night driving experiences) and/or other situational information (e.g., a number of seats in the simulated vehicle, a type of feature (e.g., NAVI system), a type of weather event, etc.).

Returning to the illustrated example of FIG. 3, the example SM source engine determines whether there are additional data sources of information pertaining to SM storage locations (e.g., either local storage locations, such as the example SM storage 316, and/or networked locations). In some examples, networked locations and/or URLs provide SMs that may be downloaded and stored in a memory of the example journey development engine 300, such as within the example SM storage 316. In some examples, the SM source reference storage identifies one or more networked locations of SM sources, such as a Git version control system or Git repository location.

With available SMs and/or SM source location(s) discovered by the example SM source engine 318, the example journey profile manager launches journey building functions. In some examples, the I/O element manager prompts the user (e.g., the simulation designer) via the example administrative GUI 233 to activate all I/O elements that are to operate in a journey profile of interest (e.g., the journey profile named "S.F. City Drive (v2)" 436). I/O elements may include all displays and/or sensors that are to operate in the journey profile of interest, such as all monitors, tablets and/or wireless telephone devices that render one or more UIs during the execution of the journey profile of interest. In some examples, the simulation designer navigates each display of interest to a particular URL to register it with the journey profile of interest as a connected device. Similarly, the simulation designer may register each sensor (e.g., smart sensor) to the journey profile of interest. Sensors may include, but are not limited to haptic feedback devices, camera modules, shift levers brake pedals, turn signals, etc.

The example journey profile manager 304 displays, generates and/or otherwise renders journey development screenshots 600 for user (e.g., simulation designer) customization, as discussed above in connection with FIG. 6. In some examples, the journey profile manager 304 retrieves and/or otherwise receives new journey information and corresponding journey states to be saved to the example journey profile storage 306. In some examples, the user (e.g., simulation designer) chooses to begin with a journey profile that has already been fully or partially completed at a prior time. In other words, a prior journey profile is loaded and the example journey profile manager 304 displays previously configured journey states having one or more corresponding SMs for each state. The one or more journey development screenshots 600 permit the user to create a specific sequence of journey events, and the example SM engine 314 provides the user with candidate SMs compatible with the journey profile (e.g., SMs associated with semi-truck specific functionality, SMs associated with navigational specific functionality, etc.).

Through the one or more journey development screenshots 600, candidate SMs are associated with journey states and specific configuration fields of each SM are populated. In some examples, software development kits (SDKs) are available to the simulation designer. For example, SDKs may facilitate context sensing and/or pattern recognition, which may include particular processing algorithms that target particular sensor output data, such as camera output data. In some examples, a camera SDK processes camera input data for particular image signatures indicative of drowsiness (e.g., threshold durations of closed eyelid detection), and generates output data identifying the potential drowsy condition. In some examples, a camera SDK processes camera input data for image signatures indicative of distracted driving (e.g., threshold durations of eye focus away from a front windshield), and generates output data identifying the potential distracted driving condition. While some example SDK types are disclosed herein, such examples are not limitations. The SDKs may be developed and distributed by third parties as executables to be incorporated into a journey profile. The example SDK integrator 322 identifies a request to install one or more SDKs and, if so, compiles the SDK into the journey profile and displays any associated SDK configuration fields that may need to be set (e.g., camera sensitivity values for drowsiness detection, etc.).

The example journey execution engine 308 determines whether a Wizard-Of-Oz (WOZ) controller is to accompany operation of the example journey profile and, if so, registers one or more interface devices to facilitate WOZ interactivity with execution of the journey profile. In some examples, the WOZ controller is a networked PC having a GUI that allows the system designer to modify trigger events during simulation execution. Trigger events may include, but are not limited to traffic light control/toggle, emergency vehicle presence on a particular road, pedestrian presence on a particular road and/or crosswalk, night/day driving conditions, weather conditions, etc.

After the journey profile has been created with a sequence of events, and after each event is customized to include one or more SMs, the example journey execution engine 308 executes the journey simulation according to the journey profile. However, in the event the user (e.g., simulation designer) wishes to modify the example simulation structure 100 and/or I/O devices that operate with it, the example I/O element manager 312 detects the request for one or more displays and/or one or more sensors to be added to the journey profile execution. In response to such a request, journey execution may be halted or stopped and the example journey profile manager 304 may be invoked to allow incorporation and/or customization of the new I/O device(s) into the journey profile. In other words, further modifications and/or configuration efforts may be applied to a simulation "on the fly."

While an example manner of implementing the journey development engine 300 of FIG. 3 is illustrated in FIGS. 1, 2, and 4-6, one or more of the elements, processes and/or devices illustrated in FIGS. 1-6 may be combined, divided, re-arranged, omitted, eliminated and/or implemented in any other way. Further, the example development environment configuration engine 302, the example journey profile manager 304, the example journey profile storage 306, the example journey execution engine 308, the example vehicle configuration engine 310, the example I/O element manager 312, the example SM engine 314, the example SM storage 316, the example SM source engine 318, the example SM source reference storage 320, the example SDK integrator 322 and/or, more generally, the example journey development engine 300 of FIG. 3 may be implemented by hardware, software, firmware and/or any combination of hardware, software and/or firmware. Thus, for example, any of the example development environment configuration engine 302, the example journey profile manager 304, the example journey profile storage 306, the example journey execution engine 308, the example vehicle configuration engine 310, the example I/O element manager 312, the example SM engine 314, the example SM storage 316, the example SM source engine 318, the example SM source reference storage 320, the example SDK integrator 322 and/or, more generally, the example journey development engine 300 of FIG. 3 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example development environment configuration engine 302, the example journey profile manager 304, the example journey profile storage 306, the example journey execution engine 308, the example vehicle configuration engine 310, the example I/O element manager 312, the example SM engine 314, the example SM storage 316, the example SM source engine 318, the example SM source reference storage 320, the example SDK integrator 322 and/or, more generally, the example journey development engine 300 of FIG. 3 is/are hereby expressly defined to include a tangible computer readable storage device or storage disk such as a memory, a digital versatile disk (DVD), a compact disk (CD), a Blu-ray disk, etc. storing the software and/or firmware. Further still, the example journey development engine 300 of FIG. 3 may include one or more elements, processes and/or devices in addition to, or instead of, those illustrated in FIGS. 1-6, and/or may include more than one of any or all of the illustrated elements, processes and devices.

Figure 7:
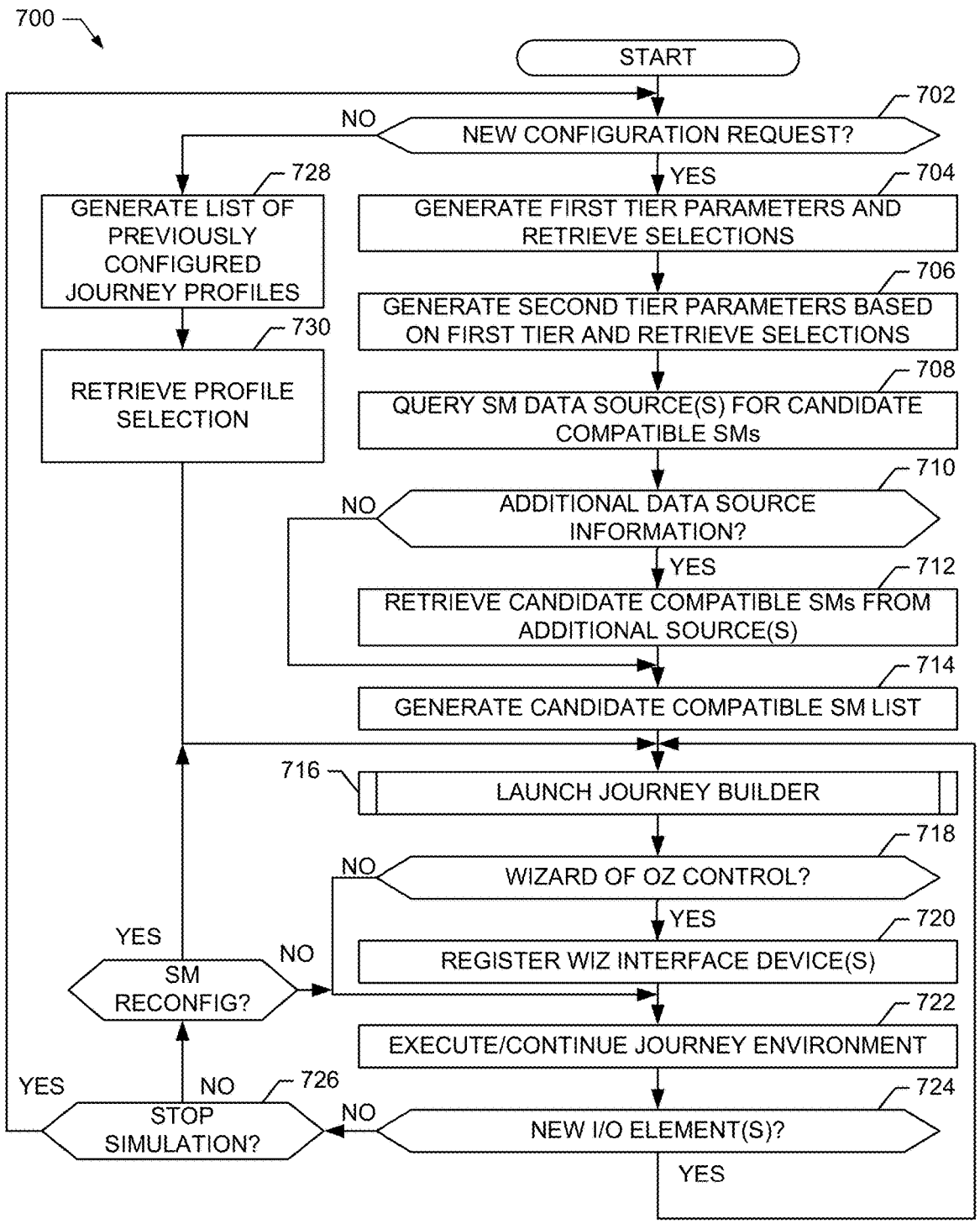
FIGS. 7, 8A and 8B are flowcharts representative of example machine readable instructions that may be executed to implement the example journey development engine of FIG. 3 and user interfaces of FIGS. 4-6.
Figure 8A:
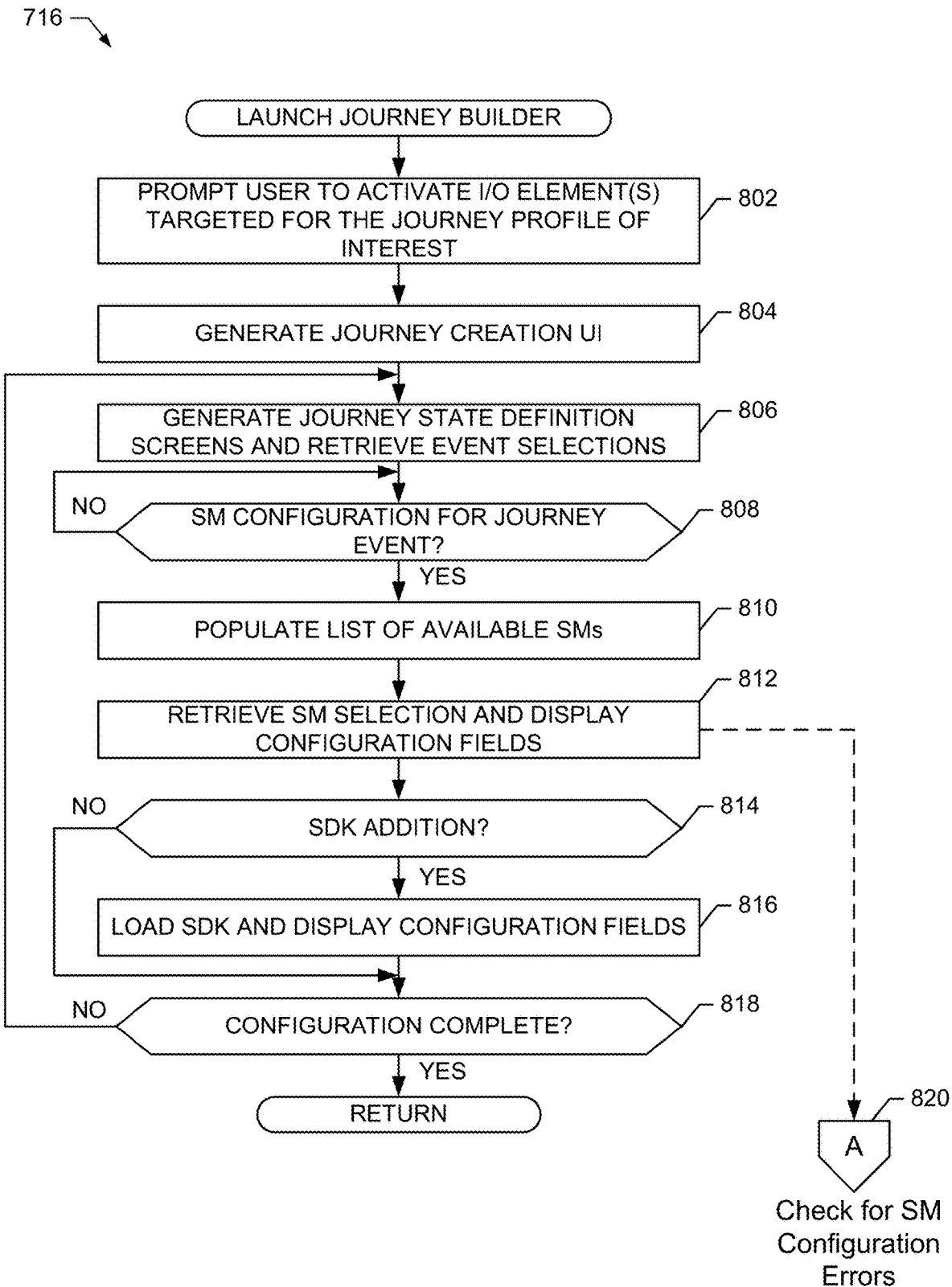
Figure 8B:
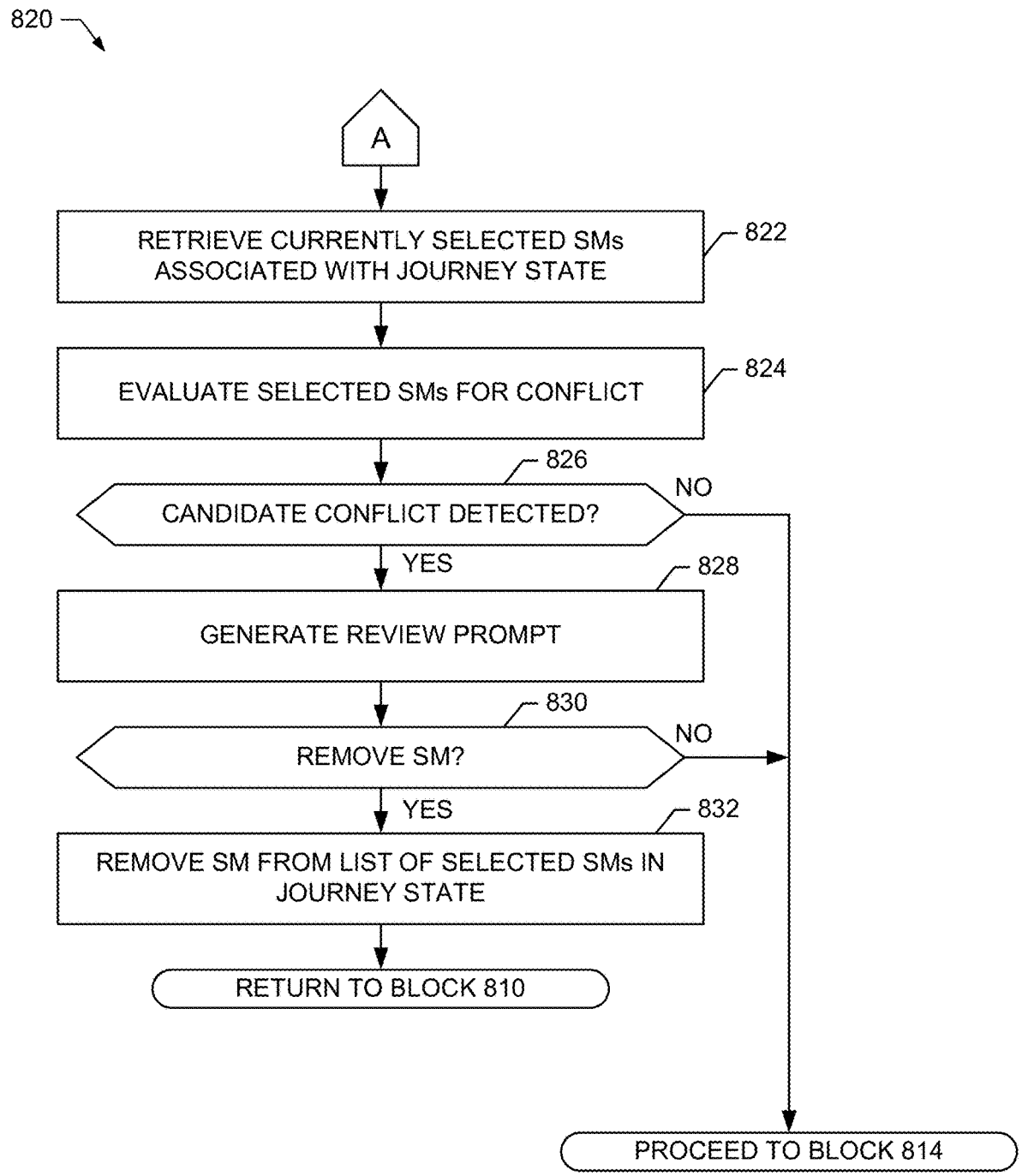

Flowcharts representative of example machine readable instructions for implementing the journey development engine 300 of FIG. 3 are shown in FIGS. 7, 8A and 8B. In these examples, the machine readable instructions comprise program(s) for execution by a processor such as the processor 1012 shown in the example processor platform 1000 discussed below in connection with FIG. 10. The program(s) may be embodied in software stored on a tangible computer readable storage medium such as a CD-ROM, a floppy disk, a hard drive, a digital versatile disk (DVD), a Blu-ray disk, or a memory associated with the processor 1012, but the entire program(s) and/or parts thereof could alternatively be executed by a device other than the processor 1012 and/or embodied in firmware or dedicated hardware. Further, although the example program(s) is/are described with reference to the flowcharts illustrated in FIGS. 7, 8A and 8B, many other methods of implementing the example journey development engine 300 may alternatively be used. For example, the order of execution of the blocks may be changed, and/or some of the blocks described may be changed, eliminated, or combined.

As mentioned above, the example processes of FIGS. 7, 8A and 8B may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 7, 8A and 8B may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

The program 700 of FIG. 7 begins at block 702 where the example development environment configuration engine 302 determines whether a request for a new journey profile configuration occurs or whether a request to use a previously developed/configured journey profile. In the event a selection is made (e.g., by the simulation developer) to create a new journey profile configuration (block 702), then the example vehicle configuration engine 310 generates a first tier environment option display (e.g., a rendered web page) and retrieves one or more high level selections related to the type of simulation vehicle (block 704). As described above in connection with FIG. 4, the example vehicle configuration engine 310 may generate the example administrative GUI 233 to allow the user to select an option to edit an existing journey profile or create a new one (see element 402 of FIG. 4), and generate an example vehicle simulation initialization screen 500. As described above, the vehicle simulation initialization screen permits retrieval of first tier environment details (see element 504 of FIG. 5), such as a vehicle type of the simulation (see element 508 and 510 of FIG. 5). Depending on the type of vehicle selected, the example vehicle configuration engine 310 generates and/or otherwise renders relevant fields for second tier environment details (see element 506 of FIG. 5) (block 706). For instance, while a cargo size field 526 may be relevant in the event a vehicle type of "delivery truck" or "delivery van" is selected, that cargo size field 526 would not be relevant in the event a vehicle type of "convertible" was selected. As such, the example vehicle configuration engine 310 generates and/or otherwise renders the relevant fields according to a selected vehicle type.

Because SMs can include simulation-specific control and/or functionality of simulation behavior in the example simulation structure 100 and components thereof, the example SM engine 314 queries the example SM storage 316 to identify candidate SMs that are compatible with preliminary selections of first tier environment options and second tier environment options (block 708). In some examples, those SMs that are deemed compatible with the first and second tier environment selections may be flagged as selectable options when defining journey events of the example journey profile, as described above and in further detail below. For instance, in the event a first SM is associated with a truck radar sensor to assist a simulation user with backing-up an 18-wheel truck to a warehouse, then that first SM would not be relevant in the event the first and second tier environment selects are related to a convertible car, pickup truck, sedan, and/or SUV. As such, those SMs that are unrelated may be withheld from presentation to the user during the configuration process, thereby preventing the user from being inundated with superfluous choices during journey profile development.

While one or more SMs may be created new and/or edited via the one or more SM development screens 600, SMs may also be developed and shared by one or more third parties in a collaborative manner. For example, SMs developed by other simulation designers on other simulation structure(s) 100 may be shared via network connectivity, uploaded to a storage service and/or uploaded to a distribution version control system, such as Git. The example SM source engine 318 queries the example SM source reference storage 320 to determine whether one or more source locations exist for additional SMs (block 710). As new SM source locations are identified, navigational information and/or access credentials may be added to the example SM source reference storage 320 for future reference. If one or more sources of SMs are available (block 710), the example SM source engine 318 navigates to the identified source and retrieves a list of candidate compatible SMs (block 712). In some examples, the SM source engine 318 facilitates a selection interface to allow one or more SMs of interest to be identified and stored locally in the example SM storage 316. Additionally, the example SM engine 314 generates a list of candidate compatible SMs that may be selected during configuration of one or more journey states (block 714).

The example journey profile manager 304 launches one or more journey development and SM development screens 600 (block 716), as described in further detail in connection with FIGS. 8A and 8B. In the illustrated example of FIG. 8A, the example I/O element manager 312 prompts the user (e.g., the simulation designer) to connect and register all I/O elements that are to participate in the simulation associated with the journey profile of interest (block 802). In some examples, the I/O element manager 312 searches a network, such as a Wi-Fi network, for candidate compatible devices that may participate with the simulation structure 100. When detected, the example I/O element manager 312 may generate a corresponding UI to allow further configuration of the detected compatible device(s). In some examples, connection and registration include the user's navigation of each participating I/O element (e.g., each display screen, each sensor) to a configuration web URL managed by the example I/O element manager 312. After each participating I/O element has been connected and registered (block 802), the example journey profile manager 304 generates a journey creation UI (block 804) as shown in FIG. 6. The example journey creation UI 602 may include one or more data entry fields to create/modify a journey name and/or allow browsing of previously created journey profiles that are saved in the example journey profile storage 306.

The example journey profile manager 304 also generates one or more journey state definition screens, such as the example journey state definition screen 604 of FIG. 6 (block 806). As described above, journey state definition screens define simulation events to occur during the simulation execution. Further, the journey states (simulation events) are further defined and/or otherwise tailored by one or more SMs that may define specific functionality of one or more UIs and/or sensors of the simulation environment 100. The example journey state definition screens 604 permit retrieval of journey states and enable the generation of corresponding state orders of operation for the simulation. As described above, each journey state of interest may include one or more SMs of interest, and the example SM engine 314 detects a request to configure one or more journey events of interest (block 808). In response to an indication or request to associate an SM with a particular journey event (block 808), the example development environment configuration engine 302 populates the list of available candidate SMs that are relevant to the simulation (block 810). Additionally, the example development environment configuration engine 302 retrieves the SM selection and generates a UI (e.g., the example SM customization screen 610 of FIG. 6) to display configuration fields/parameters associated with that particular SM operation, and retrieves field/parameter information associated therewith (block 812).

As described above, some example SMs may employ and/or otherwise work in connection with functionality enabled by software development kits (SDKs). The example SDK integrator 322 determines and/or otherwise detects whether there is a request to include and/or otherwise install an SDK with SM operation (block 814). If so, the example SDK integrator 322 loads the SDK of interest, integrates it into the SM (e.g., compiles the SDK), and displays one or more configuration fields/parameters that may be associated with SDK feature functionality (block 816). The example development environment configuration engine 302 determines if configuration of all journey states of interest and associated SMs is complete (block 818). If not, control returns to block 806 to allow the simulation designer to continue configuration activity, otherwise control returns to block 718 of FIG. 7.

Figure 9:
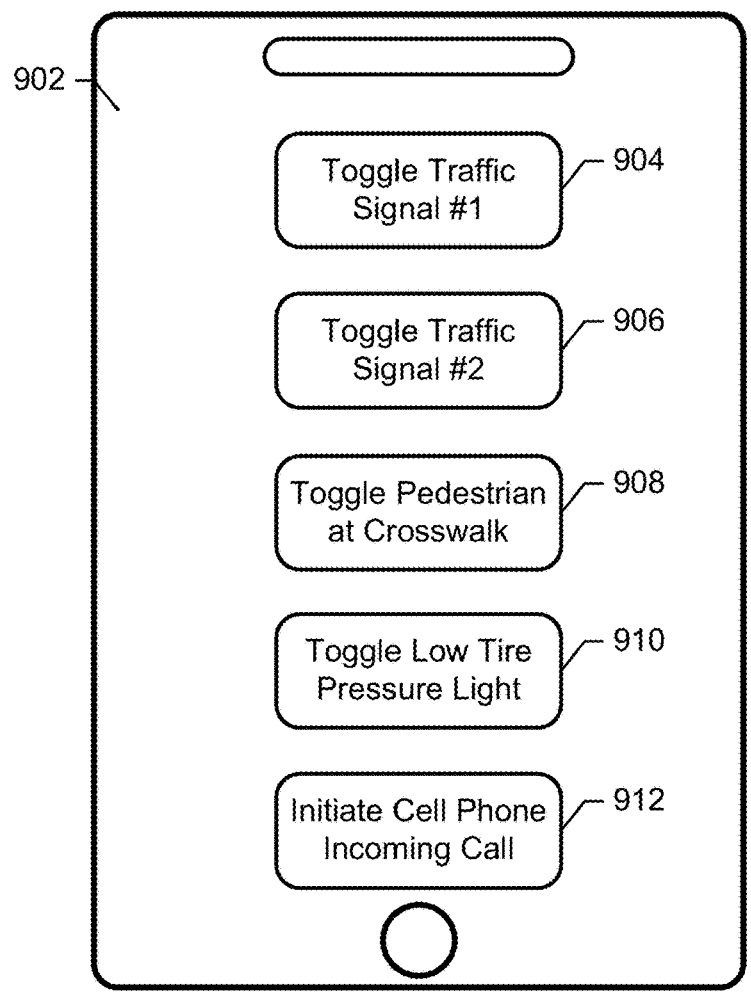
FIG. 9 is an example user interface rendered on a wireless telephone to control simulation activity of the example journey development engine of FIG. 3.

In the illustrated example of FIG. 7, the journey execution engine 308 determines whether Wizard Of Oz (WOZ) control is to be enabled during the simulation (block 718). If so, then the example journey execution engine 308 registers one or more WOZ control interface device(s) (simulation control device(s)) and generates WOZ UIs for each participating simulation control device (block 720). Turning briefly to FIG. 9, an example wireless telephone 900 is shown with an example WOZ UI 902. While the illustrated example of FIG. 9 includes a wireless telephone as the example WOZ interface device, examples disclosed herein are not limited thereto. Any number and/or type of WOZ interface device(s) may be included during the simulation, such as desktop PCs, tablet(s), laptop(s), etc., having WOZ UIs facilitated by one or more web-server services by the example journey execution engine 308. In the illustrated example of FIG. 9, the WOZ UI 902 includes a first traffic signal toggle 904 and a second traffic signal toggle 906 that, when selected, cause a corresponding traffic signal in the simulation to change (e.g., change from a green traffic light to yellow, then red). The example WOZ UI 902 also includes an example crosswalk pedestrian toggle 908 to cause a simulated pedestrian to appear at a crosswalk during the simulation. In addition to one or more WOZ controls related to the simulation and/or simulation GUI that appears before the driver and/or passenger(s), WOZ controls may also modify behaviors of in-vehicle system components. For example, the WOZ UI 902 includes a low tire pressure indicator toggle 910 to cause one or more indicator lights/signals/sounds on a dashboard of the example simulation structure 100 to change. Additionally, the example WOZ UI 902 includes an example cell phone incoming call to occur in response to selecting a cell phone call initiation button 912.

Returning to FIG. 7, when configuration of the example journey profile is complete, the example journey execution engine 308 initializes and/or otherwise executes the simulation(s) associated with the configured journey profile (block 722). However, examples disclosed herein facilitate a dynamic simulation environment that accommodates desired changes to the example simulation structure 100. In the event one or more new I/O elements are to be added or changed (block 724), as detected by the example I/O element manager 312 (e.g., in response to a new display navigating to a configuration URL), then control returns to block 716 to allow one or more changes to the journey profile to be made. On the other hand, in the event the example journey execution engine 308 identifies a request to stop the simulation (block 726), then control returns to block 702 to allow a new or alternate journey profile to be loaded, developed and/or further modified in view of preferences of the simulation designer. For example, the journey profile manager 304 may inform the simulation designer of candidate journey profiles with which to use or modify by generating a list of previously configured journey profiles stored in the example journey profile storage 306 (block 728). The example development environment configuration engine 302 retrieves the journey profile selection (block 730), and control advances to block 716 to facilitate use or further modification of the journey profile.

In some examples, the journey execution engine 308 detects and/or otherwise determines a reconfiguration request of one or more SMs of an ongoing simulation (block 732). For example, the simulation designer may be testing a first prototype temperature control interface that is built with a first set of SMs, and has collected performance data of that first prototype for future reference and evaluation. In the event the example journey execution engine 308 detects a request to reconfigure one or more SMs (block 732), control returns to block 716, thereby allowing one or more SMs to be modified "on the fly." For example, the request to reconfigure one or more SMs (block 732) may be motivated by the simulation designer's desire to test an alternate second prototype temperature control interface that is built with a second set of SMs. In some examples, the second prototype temperature control interface may be implemented with the first set of SMs that have been altered by the simulation designer, as shown in block 716 of FIG. 8A.

Returning to FIG. 8A, in some examples during configuration of one or more journeys and one or more SMs therein (block 716), the example program 716 may check for SM configuration errors after retrieving the SM selection and displaying configuration fields of block 812. In particular, after the example development environment configuration engine 302 retrieves SM selections (block 812), control advances to checking for SM configuration errors (block 820), as described in further detail in FIG. 8B.

In the illustrated example of FIG. 8B, the development environment configuration engine 302 retrieves all of the currently selected SMs associated with a journey state of interest (block 822), and evaluates those selected SMs for potential conflicts (block 824). Conflicts may occur when one or more SMs are selected that conflict with one or more simulation objectives, or when one or more SMs are selected that may be mutually exclusive. For example, a first SM may invoke a request that the graphics engine (e.g., a Unity® graphics engine hosted by the example PC 202, hosted by the example journey execution engine 308) display a night-time driving experience. However, in the event that the simulation designer also selected a second SM within the journey state of interest that invokes a request for a low-horizon sun-in-the-eyes scene, then the example first SM and second SM may be mutually exclusive to the desired simulation experience.

Another example SM configuration error may include a first SM selected to invoke a high-speed freeway driving experience, while a second SM may have been also selected to invoke a wireless phone configuration screen. However, permitting a trainee to interact with such detailed configuration operations may conflict with local/regional traffic laws related to distracted driving and/or may run afoul to safety best practices. If the example development environment configuration engine 302 detects such potential SM configuration errors (block 826), then it may generate a review prompt UI for the simulation designer to confirm whether these potentially conflicting SMs should remain in the configured journey state (block 828). The development environment configuration engine 302 retrieves an instruction from the UI whether the offending SM should be removed from the journey event (block 830) and, if so, the offending SM(s) are removed from the journey event (block 832), and control returns to block 810 of FIG. 8A.

On the other hand, the simulation designer may decide that the potentially offending SM should not be removed (block 830). Continuing with the example where the first SM is associated with a high-speed freeway simulation and the second SM is associated with an invitational prompt to configure a wireless telephone, the simulation designer may be interested in evaluating and/or observing trainee tendencies to engage in potentially dangerous activities while driving at a relatively high rate of speed. If so, then control returns to block 814 of FIG. 8A and the SM(s) are not removed.

Figure 10:
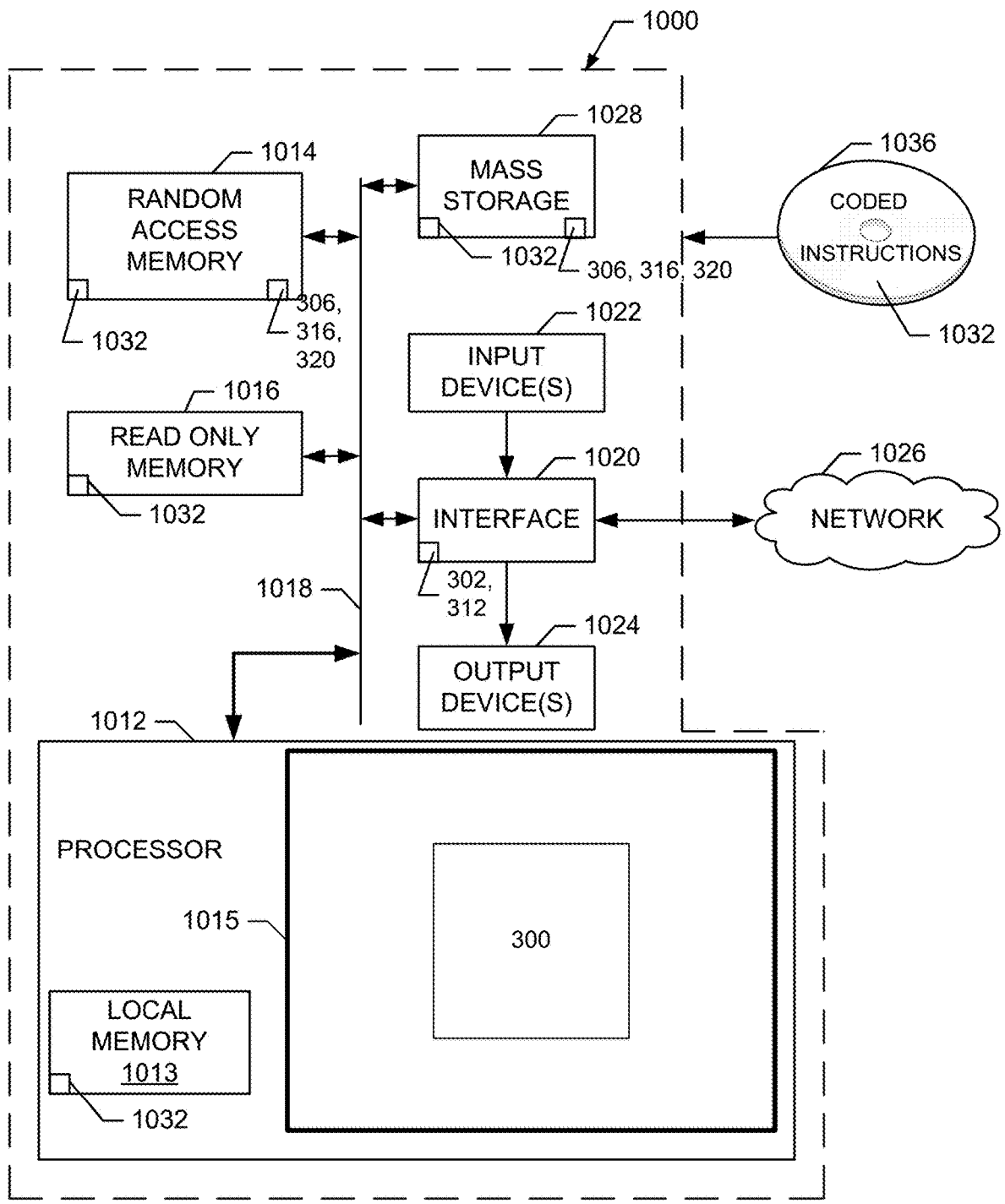
FIG. 10 is a block diagram of an example processor platform structured to execute the example machine readable instructions of FIGS. 7, 8A and 8B to implement the example journey development engine of FIG. 3.

FIG. 10 is a block diagram of an example processor platform 1000 capable of executing the instructions of FIGS. 7, 8A and 8B to implement the journey development engine 300 of FIG. 3. The processor platform 1000 can be, for example, a server, a personal computer, a mobile device (e.g., a cell phone, a smart phone, a tablet such as an iPad™), a personal digital assistant (PDA), an Internet appliance, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer. In the illustrated example of FIG. 10, the processor 1000 includes one or more example processing cores 1015 configured via example instructions 1032, which include the example instructions of FIGS. 7, 8A and 8B to implement the example journey development engine 300 of FIG. 3.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives. In some examples, the mass storage device 1028 may implement the example journey profile storage 306, the example SM storage 316 and/or the example SM source reference storage 320.

The coded instructions 1032 of FIGS. 7, 8A and 8B may be stored in the mass storage device 1028, in the volatile memory 1014, in the non-volatile memory 1016, and/or on a removable tangible computer readable storage medium such as a CD or DVD.

From the foregoing, it will be appreciated that the above disclosed methods, apparatus and articles of manufacture facilitate a development platform on which vehicle feature prototyping, design and/or experimentation can occur in an efficient manner without laborious low-level code effort and/or reliance upon coding personnel. Examples disclosed herein improve simulation design efficiency and reduce costs for such simulation development by enabling dynamic reconfiguration of participating hardware and flexible simulation event modification.

Additionally, examples disclosed herein facilitate an interaction-focused simulator environment with the ability to highlight a driving route and allow one or more participants to provide feedback on prototype designs of vehicle controls and/or user interfaces. Prototypes may be implemented with one or more SMs, and feedback data may be logged so that A/B testing of different prototypes may occur. Additionally, in the event the example simulator is to evaluate one or more prototype system(s) of the vehicle, examples disclosed herein may alter the physics engine behavior settings so that a relatively greater degree of operator/passenger focus can reside on in-vehicle prototype interactions with less focus on the physics ramifications of the simulation experience (e.g., hitting a parked car during the simulation will not halt the simulation, turning the steering wheel will not result in the simulated visual scene moving off a straight road, etc.).

Furthermore, examples disclosed herein facilitate flexibility when altering a simulated environment. In the event a new display is to be added to the simulation environment, examples disclosed herein register the display and render one or more default viewing zones of the display. Additionally, configuration of the viewing zones is facilitated by a web-based user interface rather than reliance upon skilled professional code development personnel. Further, because examples disclosed herein employ web-based technologies, industry standard communication protocols and other industry standard technologies, implementation of the example simulation environment may occur in a platform agnostic manner.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

Example methods, apparatus, systems and articles of manufacture to develop in-vehicle experiences in simulated environments are disclosed herein. Further examples and combinations thereof include the following.

Example 1 is an apparatus to improve simulation design efficiency, comprising a vehicle configuration engine to retrieve first tier environment parameters associated with a simulation type, and generate second tier environment parameters associated with the simulation type, a simulation modifier (SM) source engine to identify a source of SMs, and distinguish respective ones of the source of SMs that are compatible with the simulation type and the second tier environment parameters, and a development environment configuration engine to improve simulation design efficiency by associating simulation events with only the respective ones of the SMs that are compatible with the simulation type.

Example 2 includes the apparatus as defined in example 1, further including an SM source reference storage to store the source of SMs.

Example 3 includes the apparatus as defined in example 2, wherein the SM source reference storage stores the source of SMs as at least one of network locations, uniform resource locators, or Git repository locations.

Example 4 includes the apparatus as defined in example 1, further including an input/output (I/O) element manager to detect candidate compatible devices in a simulation environment.

Example 5 includes the apparatus as defined in example 4, wherein the I/O element manager is to generate a configuration user interface for respective ones of the detected candidate compatible devices.

Example 6 includes the apparatus as defined in example 1, further including a journey profile manager to generate a journey creation user interface to define simulation events of a simulation associated with the simulation type.

Example 7 includes the apparatus as defined in example 6, wherein the journey profile manager is to generate an order of the simulation events to occur during the simulation.

Example 8 includes the apparatus as defined in example 6, wherein the development environment configuration engine is to generate an SM customization user interface to facilitate configuration of the respective ones of the SMs that are compatible with the simulation type.

Example 9 includes the apparatus as defined in example 1, further including a software development kit (SDK) integrator to install an SDK with one of the SMs that are compatible with the simulation type.

Example 10 includes the apparatus as defined in example 1, further including a journey execution engine to register a simulation control device in response to a request for a Wizard Of Oz control request.

Example 11 includes the apparatus as defined in example 10, wherein the journey execution engine is to facilitate real-time control over a simulation compatible with the simulation type.

Example 12. A method to improve simulation design efficiency, including retrieving, by executing an instruction with a processor, first tier environment parameters associated with a simulation type, generating, by executing an instruction with the processor, second tier environment parameters associated with the simulation type, identifying, by executing an instruction with the processor, a source of SMs, distinguishing, by executing an instruction with the processor, respective ones of the source of SMs that are compatible with the simulation type and the second tier environment parameters, and improving simulation design efficiency by associating, by executing an instruction with the processor, simulation events with only the respective ones of the SMs that are compatible with the simulation type.

Example 13 includes the method as defined in example 12, further including storing the source of SMs in an SM source reference storage.

Example 14 includes the method as defined in example 13, further including storing the source of SMs as at least one of network locations, uniform resource locators, or Git repository locations.

Example 15 includes the method as defined in example 12, further including detecting candidate compatible devices in a simulation environment.

Example 16 includes the method as defined in example 15, further including generating a configuration user interface for respective ones of the detected candidate compatible devices.

Example 17 includes the method as defined in example 12, further including generating a journey creation user interface to define simulation events of a simulation associated with the simulation type.

Example 18 includes the method as defined in example 17, further including generating an order of the simulation events to occur during the simulation.

Example 19 includes the method as defined in example 17, further including generating an SM customization user interface to facilitate configuration of the respective ones of the SMs that are compatible with the simulation type.

Example 20 includes the method as defined in example 12, further including installing a software development kit (SDK) with one of the SMs that are compatible with the simulation type.

Example 21 includes the method as defined in example 12, further including registering a simulation control device in response to a request for a Wizard Of Oz control request.

Example 22 includes the method as defined in example 21, further including facilitating real-time control over a simulation compatible with the simulation type.

Example 23. A tangible computer-readable medium including instructions that, when executed, cause a processor to, at least, retrieve first tier environment parameters associated with a simulation type, generate second tier environment parameters associated with the simulation type, identify a source of SMs, distinguish respective ones of the source of SMs that are compatible with the simulation type and the second tier environment parameters, and improve simulation design efficiency by associating simulation events with only the respective ones of the SMs that are compatible with the simulation type.

Example 24 includes the computer-readable medium as defined in example 23, wherein the instructions, when executed, further cause the processor to store the source of SMs in an SM source reference storage.

Example 25 includes the computer-readable medium defined in example 24, wherein the instructions, when executed, further cause the processor to store the source of SMs as at least one of network locations, uniform resource locators, or Git repository locations.

Example 26 includes the computer-readable medium as defined in example 23, wherein the instructions, when executed, further cause the processor to detect candidate compatible devices in a simulation environment.

Example 27 includes the computer-readable medium as defined in example 26, wherein the instructions, when executed, further cause the processor to generate a configuration user interface for respective ones of the detected candidate compatible devices.

Example 28 includes the computer-readable medium as defined in example 23, wherein the instructions, when executed, further cause the processor to generate a journey creation user interface to define simulation events of a simulation associated with the simulation type.

Example 29 includes the computer-readable medium as defined in example 28, wherein the instructions, when executed, further cause the processor to generate an order of the simulation events to occur during the simulation.

Example 30 includes the computer-readable medium as defined in example 28, wherein the instructions, when executed, further cause the processor to generate an SM customization user interface to facilitate configuration of the respective ones of the SMs that are compatible with the simulation type.

Example 31 includes the computer-readable medium as defined in example 23, wherein the instructions, when executed, further cause the processor to install a software development kit (SDK) with one of the SMs that are compatible with the simulation type.

Example 32 includes the computer-readable medium as defined in example 23, wherein the instructions, when executed, further cause the processor to register a simulation control device in response to a request for a Wizard Of Oz control request.

Example 33 includes the computer-readable medium as defined in example 32, wherein the instructions, when executed, further cause the processor to facilitate real-time control over a simulation compatible with the simulation type.

Example 34. A system to improve simulation design efficiency, the system including means for retrieving first tier environment parameters associated with a simulation type, means for generating second tier environment parameters associated with the simulation type, means for identifying a source of SMs, means for distinguishing respective ones of the source of SMs that are compatible with the simulation type and the second tier environment parameters, and means for improving simulation design efficiency by associating simulation events with only the respective ones of the SMs that are compatible with the simulation type.

Example 35 includes the apparatus as defined in example 34, further including means for storing the source of SMs to an SM source reference storage.

Example 36 includes the system as defined in example 35, further including means for storing the source of SMs as at least one of network locations, uniform resource locators, or Git repository locations.

Example 37 includes the system as defined in example 34, further including means for detecting candidate compatible devices in a simulation environment.

Example 38 includes the system as defined in example 37, further including means for generating a configuration user interface for respective ones of the detected candidate compatible devices.

Example 39 includes the system as defined in example 34, further including means for generating a journey creation user interface to define simulation events of a simulation associated with the simulation type.

Example 40 includes the system as defined in example 39, further including means for generating an order of the simulation events to occur during the simulation.

Example 41 includes the system as defined in example 39, further including means for generating an SM customization user interface to facilitate configuration of the respective ones of the SMs that are compatible with the simulation type.

Example 42 includes the system as defined in example 34, installing a software development kit (SDK) with one of the SMs that are compatible with the simulation type.

Example 43 includes the system as defined in example 34, further including means for registering a simulation control device in response to a request for a Wizard Of Oz control request.

Example 44 includes the system as defined in example 43, further including means for facilitating real-time control over a simulation compatible with the simulation type.

What is claimed is:

1. An apparatus to improve simulation design efficiency, comprising:
    a vehicle configuration engine to:
        retrieve first tier environment parameters associated with a simulation type; and
        generate second tier environment parameters associated with the simulation type;
    a simulation modifier (SM) source engine to:
        identify a source of SMs; and
        distinguish respective ones of the source of SMs that are compatible with the simulation type and the second tier environment parameters; and
    a development environment configuration engine to improve simulation design efficiency of a simulation program by withholding the respective ones of the SMs from being presented in a selectable list that are not compatible with the simulation type.

2. The apparatus as defined in claim 1, further including an SM source reference storage to store the source of SMs.

3. The apparatus as defined in claim 2, wherein the SM source reference storage is to store the source of SMs as at least one of network locations, uniform resource locators, or Git repository locations.

4. The apparatus as defined in claim 1, further including an input/output (I/O) element manager to detect candidate compatible devices in a simulation environment.

5. The apparatus as defined in claim 4, wherein the I/O element manager is to generate a configuration user interface for respective ones of the detected candidate compatible devices.

6. The apparatus as defined in claim 1, further including a journey profile manager to generate a journey creation user interface to define simulation events, the simulation events corresponding to a simulation associated with the simulation type.

7. The apparatus as defined in claim 6, wherein the journey profile manager is to generate an order of the simulation events to occur during the simulation.

8. A method to improve simulation design efficiency, comprising:
    retrieving, by executing an instruction with a processor, first tier environment parameters associated with a simulation type;
    generating, by executing an instruction with the processor, second tier environment parameters associated with the simulation type;
    identifying, by executing an instruction with the processor, a source of SMs;
    distinguishing, by executing an instruction with the processor, respective ones of the source of SMs that are compatible with the simulation type and the second tier environment parameters; and
    improving simulation design efficiency of a simulation program by withholding, by executing an instruction with the processor, the respective ones of the SMs from being presented in a selectable list that are not compatible with the simulation type.

9. The method as defined in claim 8, further including storing the source of SMs in an SM source reference storage.

10. The method as defined in claim 9, further including storing the source of SMs as at least one of network locations, uniform resource locators, or Git repository locations.

11. The method as defined in claim 8, further including detecting candidate compatible devices in a simulation environment.

12. The method as defined in claim 8, further including installing a software development kit (SDK) with one of the SMs that are compatible with the simulation type.

13. The method as defined in claim 8, further including registering a simulation control device in response to a request for a Wizard Of Oz control request.

14. The method as defined in claim 13, further including facilitating real-time control over a simulation compatible with the simulation type.

15. A tangible computer-readable medium comprising instructions that, when executed, cause a processor to, at least:
    retrieve first tier environment parameters associated with a simulation type;
    generate second tier environment parameters associated with the simulation type;
    identify a source of simulation modifiers (SMs);
    distinguish respective ones of the source of SMs that are compatible with the simulation type and the second tier environment parameters; and
    improve simulation design efficiency of a simulation program by withholding the respective ones of the SMs from being presented in a selectable list that are not compatible with the simulation type.

16. The computer-readable medium as defined in claim 15, wherein the instructions, when executed, further cause the processor to store the source of SMs in an SM source reference storage.

17. The computer-readable medium defined in claim 16, wherein the instructions, when executed, further cause the processor to store the source of SMs as at least one of network locations, uniform resource locators, or Git repository locations.

18. The computer-readable medium as defined in claim 15, wherein the instructions, when executed, further cause the processor to detect candidate compatible devices in a simulation environment.

19. The computer-readable medium as defined in claim 18, wherein the instructions, when executed, further cause the processor to generate a configuration user interface for respective ones of the detected candidate compatible devices.

20. The computer-readable medium as defined in claim 15, wherein the instructions, when executed, further cause the processor to generate a journey creation user interface to define simulation events of a simulation associated with the simulation type.

* * * * *